(12) United States Patent
Chern et al.

(10) Patent No.: US 8,709,684 B2
(45) Date of Patent: Apr. 29, 2014

(54) AUTOMATIC MISALIGNMENT BALANCING SCHEME FOR MULTI-PATTERNING TECHNOLOGY

(75) Inventors: Chan-Hong Chern, Palo Alto, CA (US);
 Tao Wen Chung, San Jose, CA (US);
 Ming-Chieh Huang, San Jose, CA (US);
 Chih-Chang Lin, San Jose, CA (US);
 Tsung-Ching (Jim) Huang, San Jose, CA (US); Fu-Lung Hsueh, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 13/562,436

(22) Filed: Jul. 31, 2012

(65) Prior Publication Data

US 2014/0038085 A1 Feb. 6, 2014

(51) Int. Cl.
 *G03F 1/68* (2012.01)
(52) U.S. Cl.
 USPC ...... 430/5; 430/30; 716/50; 716/55; 716/126; 716/127; 716/128; 716/129; 716/130; 716/131

(58) Field of Classification Search
 USPC ............ 430/5, 30; 716/50, 55, 126, 127, 128, 716/129, 130, 131
 See application file for complete search history.

(56) References Cited

U.S. PATENT DOCUMENTS

| | | | |
|---|---|---|---|
| 8,245,174 B2 * | 8/2012 | Cheng et al. | 716/126 |
| 2011/0023002 A1 * | 1/2011 | Cheng et al. | 716/126 |

* cited by examiner

*Primary Examiner* — Christopher Young
(74) *Attorney, Agent, or Firm* — Eschweiler & Associates, LLC

(57) ABSTRACT

Some aspects of the present disclosure provide for a method of automatically balancing mask misalignment for multiple patterning layers to minimize the consequences of mask misalignment. In some embodiments, the method defines a routing grid for one or more double patterning layers within an IC layout. The routing grid has a plurality of vertical grid lines extending along a first direction and a plurality of horizontal grid lines extending along a second, orthogonal direction. Alternating lines of the routing grid in a given direction (e.g., the horizontal and vertical direction) are assigned different colors. Shapes on the double patterning layers are then routed along the routing grid in a manner that alternates between different colored grid lines. By routing in such a manner, variations in capacitive coupling caused by mask misalignment are reduced.

20 Claims, 6 Drawing Sheets

AUTOMATIC MISALIGNMENT BALANCING SCHEME FOR MULTI-PATTERNING TECHNOLOGY

BACKGROUND

Over the last four decades, the semiconductor industry has continually improved the speed and power of integrated chips (ICs) by reducing the size of components within the ICs. In large part, the ability to shrink the size of components within an integrated chip is driven by lithographic resolution. In recent years however, tool vendors have been unable to decrease the wavelength of illumination sources (e.g., to successfully implement EUV or x-ray lithography), so that developing technology nodes often have minimum feature sizes less than the wavelength of illumination used in exposure tools. Therefore, IC fabrication processes have been forced to use tricks (e.g., immersion lithography, dual tone resist, etc.) that improve the resolution of existing lithography tools in a manner that extends their usefulness.

Double patterning lithography (DPL) is one lithography strategy that is used in advanced technology nodes. To perform DPL, an IC layout is decomposed according to an algorithm that assigns different colors (e.g., black and gray) to shapes separated by a space less than a printable threshold. The different colors correspond to different photomasks, such that features of a same color are formed on one mask of a double patterning exposure. By separating IC layout data onto different masks, printing below a printable threshold is enabled since the features comprised within each separate mask do not violate the printable threshold.

DETAILED DESCRIPTION

Figure 1:
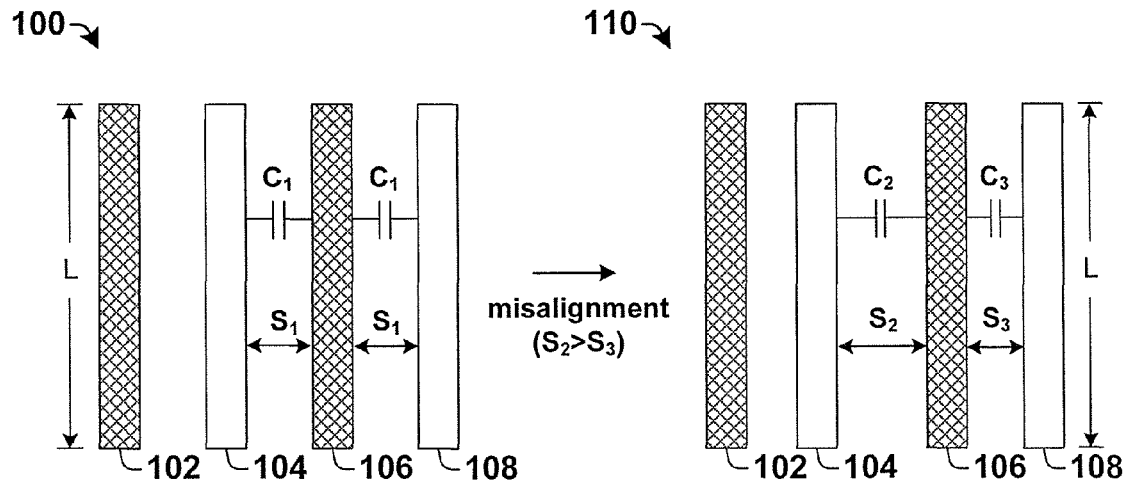
FIG. 1 is a block diagram showing an overlay error on metal line segments formed using a double patterning lithography.

The description herein is made with reference to the drawings, wherein like reference numerals are generally utilized to refer to like elements throughout, and wherein the various structures are not necessarily drawn to scale. In the following description, for purposes of explanation, numerous specific details are set forth in order to facilitate understanding. It may be evident, however, to one of ordinary skill in the art, that one or more aspects described herein may be practiced with a lesser degree of these specific details. In other instances, known structures and devices are shown in block diagram form to facilitate understanding.

The use of multiple patterning lithography allows for a lithographic tool to print design features having a minimum feature size smaller than that printable on a single photomask (mask). However, breaking an integrated chip layout onto multiple masks can introduce an overlay error from a misalignment between the masks. FIG. 1 is a block diagram showing integrated circuits, 100 and 110, that illustrate an exemplary overlay error $\Delta_E$ for a double patterning lithography. The integrated circuits 100, 110 comprise metal line segments 102-108. Metal line segments 102 and 106 are formed by a first mask and metal line segments 104 and 108 are formed by a second mask.

Integrated circuit 100 was formed without misalignment between the first and second masks, resulting in metal line segments 102-108 that are evenly spaced apart from one another by a spacing of $S_1$. The spacing $S_1$ results in a first capacitive coupling $C_1$ between metal line segments 104 and 106 that is proportional to $\in \cdot L/S_1$, wherein $\in$ is the dielectric constant of a material (e.g., a low-k dielectric) between the metal line segments and L is the common runlength of the metal line segments.

Integrated circuit 110 was formed with a misalignment of the second mask relative to the first mask, resulting in an overlay error $\Delta_E$. The overlay error $\Delta_E$ causes metal line segment 106 (formed by the first mask) to move relative to metal line segments 104 and 108 (formed by the second mask), resulting in a space $S_2=S_1+\Delta_E$ between the metal line segments 104 and 106 and a space $S_3=S_1-\Delta_E$ between the metal line segments 106 and 108. The space $S_2$ results in a second capacitive coupling of $C_2$ between metal line segments 104 and 106, which is smaller than the capacitive coupling $C_1$ (e.g., $C_2<C_1$), while space $S_3$ results in a third capacitive coupling of $C_3$ between metal line segments 106 and 108, which is larger than the capacitive coupling $C_1$ ($C_3>C_1$).

Variation in capacitive coupling between adjacent metal line segments can cause timing issues within an integrated chip. For example, an increase in capacitive coupling may cause an RC delay cross-coupling of signals being conveyed by a metal line segment to increase, slowing operation of the integrated chip. To avoid performance degradation caused by such variations in capacitive coupling a designer may make design changes (e.g., increase spacing or driver sizes to account maximum delays caused by the a worst case spacing that decreases misalignment errors, add buffers to account for minimum delays caused by a worst case spacing that increases misalignment errors, etc.). However, such design changes are undesirable since they overly increase the size of an integrated chip and/or the power consumed by the integrated chip.

Accordingly, some aspects of the present disclosure provide for a method of automatically balancing the effects of mask misalignment for multiple patterning layers, so as to minimize the consequences of mask misalignment. In some embodiments, the method comprises defining a routing grid for one or more double patterning layers within an IC layout. The routing grid comprises a plurality of vertical grid lines extending along a first direction and a plurality of horizontal grid lines extending along a second, orthogonal direction. Alternating grid lines in a given direction (e.g., the horizontal and vertical direction) are assigned different colors. Shapes on the double patterning layers are then routed along the routing grid in a manner that alternates between different colored grid lines. By routing in such a manner, the routed shapes will statistically average spacing variations caused by mask misalignment, thereby reducing the effects of mask misalignment (e.g., variations in capacitive coupling).

It will be appreciated that as described herein, a "multi patterning layer" refers to any layer of an integrated chip design upon which multiple lithography patterning (i.e., more than one photomask exposure) is used to form the layer. For example, in some embodiments, the multi patterning layer may comprise a "double patterning layer", which refers to any layer of an integrated chip design upon which double patterning lithography is performed. Although the disclosed methods are described below in relation to a double patterning layer comprising a metallization layer (i.e., a metal interconnect layer), one of ordinary skill in the art will appreciate that the disclosure is not limited to such layers. Rather, the disclosure may be applied to any layer using a double patterning lithography process, such as local interconnect layers (e.g., metal zero layers), polysilicon layers, oxide definition layers, etc. formed by double patterning lithography.

Figure 2:
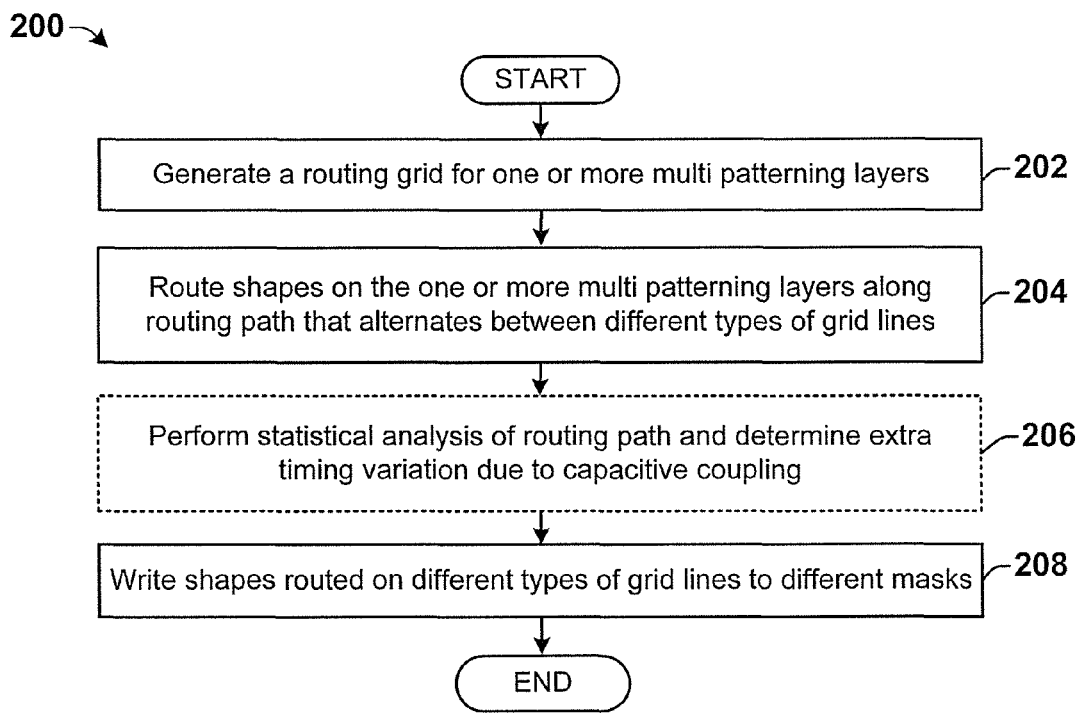
FIG. 2 is a flow diagram of a method for balancing the effects of mask misalignment in a multi patterning lithography process, in accordance with some embodiments.

FIG. 2 illustrates some embodiments of a method 200 of balancing mask misalignment effects (e.g., variations in capacitive coupling) resulting from a double patterning lithography process. By balancing mask misalignment effects, the method 200 minimizes the consequences of mask misalignment.

At step 202, a routing grid is generated for one or more multi patterning layers within an IC layout. The routing grid comprises a plurality of vertical grid lines extending along a first direction and a plurality of horizontal grid lines extending along an orthogonal, second direction. The horizontal and vertical grid lines comprise different types of grid lines, wherein respective types of grid lines are associated with a separate mask. In some embodiments, the vertical grid lines define a routing grid for a first double patterning layer (e.g., metal 1) having different types of grid lines comprising odd vertical grid lines (e.g., a first, third, fifth, etc., grid line) interleaved with adjacent even vertical grid lines (e.g., a second, fourth, sixth, etc., grid line). In some embodiments, the horizontal grid lines define a routing grid for a second double patterning layer (e.g., metal 2) having different types of grid lines comprising odd horizontal grid lines (e.g., a first, third, fifth, etc., grid line) interleaved with adjacent even horizontal grid lines (e.g., a second, fourth, sixth, etc., grid line).

In some embodiments, the routing grid comprises a minimum routing grid having vertical grid lines separated by a first minimum pitch and horizontal grid lines separated by a second minimum pitch. The minimum pitches are defined according to ground rules specific to a technology node and may vary for different double patterning layers (e.g., causing different layers to have different grid structures). For example, a double patterning layer comprising a first metal layer may have a minimum pitch (e.g., a center-to-center distance) of 60 nm in a given technology node, while a double patterning layer comprising a vertically adjacent, second metal layer may have a minimum pitch of 70 nm in the same technology node.

At step 204, shapes on the one or more multi patterning layers are routed along a routing path having a stair-step pattern that alternates between different types of grid lines. For example, in some embodiments, the routing path alternates between even and odd vertical grid lines and between even and odd horizontal grid lines. The stair-step pattern alternates between a horizontal and vertical direction. In the horizontal direction, the double patterning layer is routed to consecutively alternate between even and odd horizontal grid lines. In the vertical direction, the double patterning layer is routed to consecutively alternate between even and odd vertical grid lines.

For example, in some embodiments routed shapes may comprise a first metal layer (e.g., metal 1) routed along an even vertical grid line, a second metal layer (e.g., metal 2) routed along an even horizontal grid line, the first metal layer routed along an odd vertical grid line, and the second metal layer routed along an odd horizontal grid line. In such embodiments, metal vias (i.e., contacts) are posited between the first and second metal layers at turns in the routing path. For example, a first metal layer routed along an even vertical grid line is connected to a second metal layer routed along an odd horizontal grid line by way of a via extending between the first metal layer and the horizontally adjacent, second metal layer.

Routing a double patterning layer along a routing path that alternates between different types of grid lines statistically reduces variations in spaces between routed shapes and adjacent shapes. For example, routing the double patterning layer along a routing path that alternates between even and odd grid lines causes the routed double patterning layer to be formed by both masks used in a double patterning lithography process. By routing along a path that uses both masks, the resulting routing path will have a combination of mask misalignments that cause both increases and decreases in spaces between routed shapes and other adjacent shapes. Over the routing path, increases in spacing are statistically balanced (i.e., averaged) with decreases in spacing, thereby balancing the effects of mask misalignment and minimizing the consequences of mask misalignment. For example, the capacitive coupling caused by areas having a maximum misalignment (i.e., line spacing) are balanced with the capacitive coupling caused by areas having a minimum misalignment (i.e., line spacing).

In some embodiments, shapes on the double patterning layers are routed automatically by an automatic place and route tool (i.e., a software program configured to automatically layout a double patterning layer along a routing path). In other embodiments, shapes on the double patterning layers are routed manually. If shapes on the double patterning layers are routed manually, the method 200 may further provide an indicator to a graphical interface used by designers, which provides guidance to perform manual routing along a routing path that alternatively switches routed shapes between different types of grid lines (e.g., between even and odd grid lines).

In some embodiments, statistical analysis of the routing path is performed to determine an amount of extra timing variation from maximum varied capacitive coupling. Based upon the extra timing variation extra space (e.g., chip area) within the design may be allocated to account for mask misalignment, at step 206. For example, the method may statistically determine an average capacitive coupling along a routed metal line and then determine an amount of extra space that the design will use to account for timing variations due to the statistically determined average capacitive coupling (e.g., space needed for buffers, extra spacing between adjacent lines, etc.).

At step 208, shapes routed on different types of grid lines are written to different photomasks. For example, shapes routed on "odd" vertical grid lines (e.g., a first, third, fifth, etc., grid line) are written to a first mask and shapes routed on "even" vertical grid lines (e.g., a second, fourth, sixth, etc., grid line) are written to a second mask. Similarly, shapes routed on "odd" horizontal grid lines (e.g., a first, third, fifth, etc., grid line) are written to a third mask and shapes routed on "even" horizontal grid lines (e.g., a second, fourth, sixth, etc., grid line) are written to a fourth mask.

Figure 3:
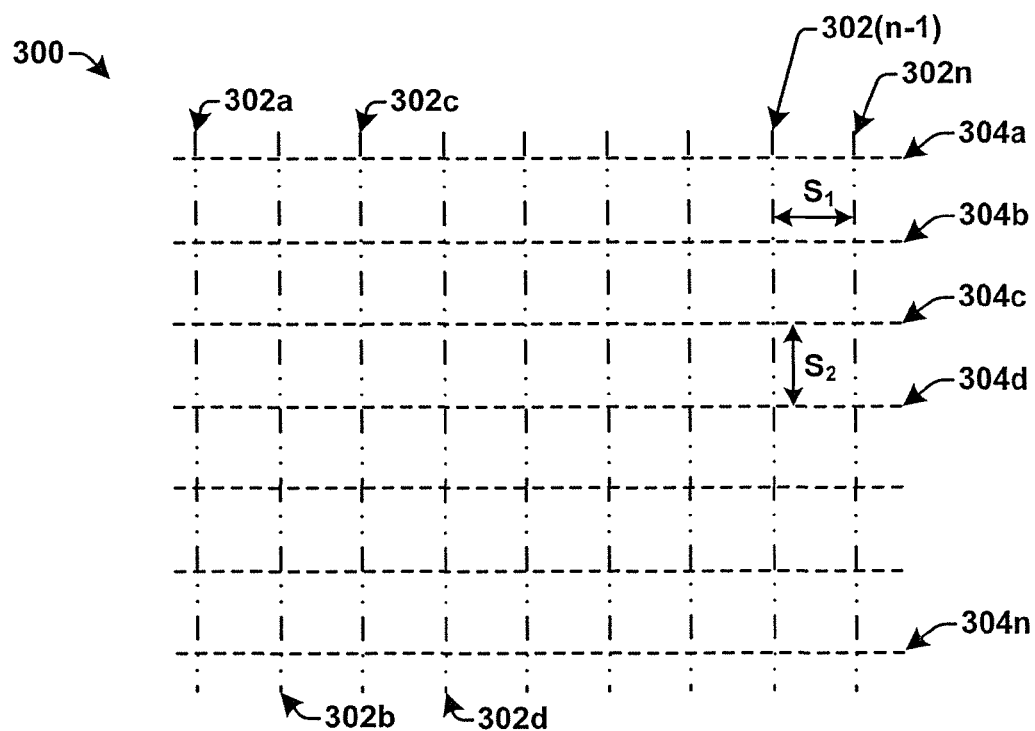
FIG. 3 illustrates some embodiments of a disclosed routing grid for a double patterning layer.
Figure 4A:
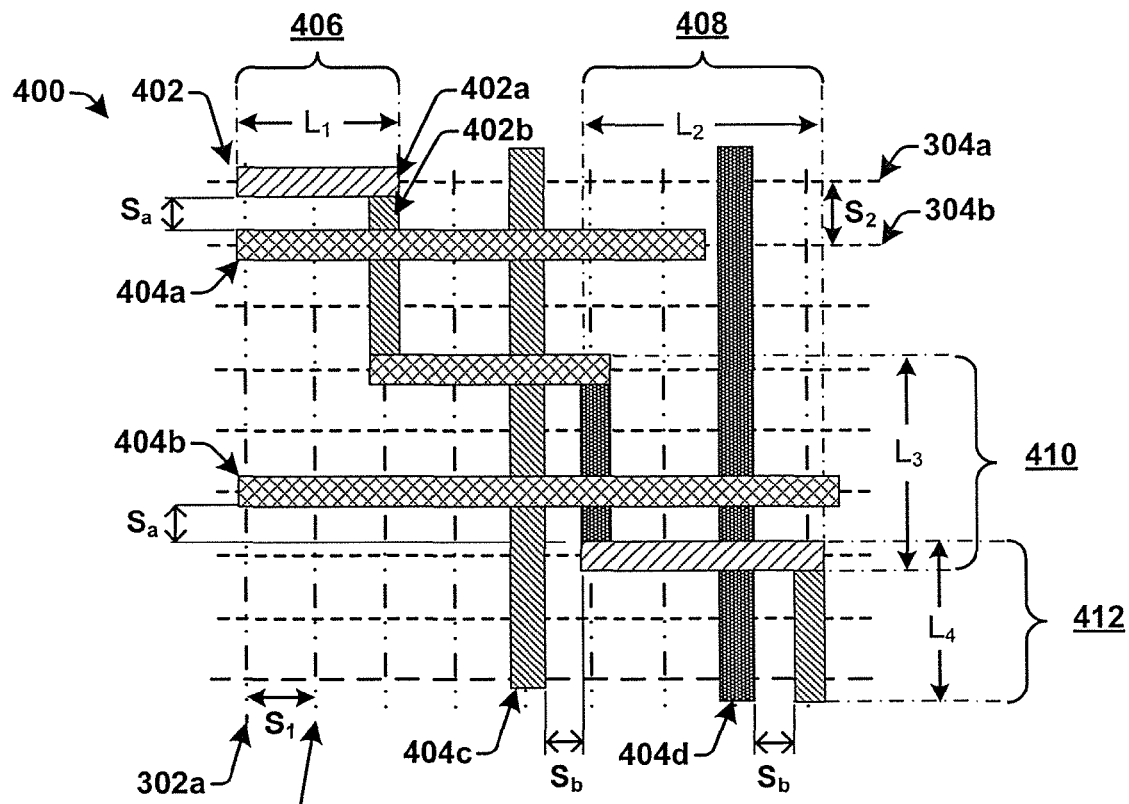
FIG. 4A illustrates some embodiments of an integrated circuit formed on the routing grid of FIG. 3 without mask misalignment.
Figure 4B:
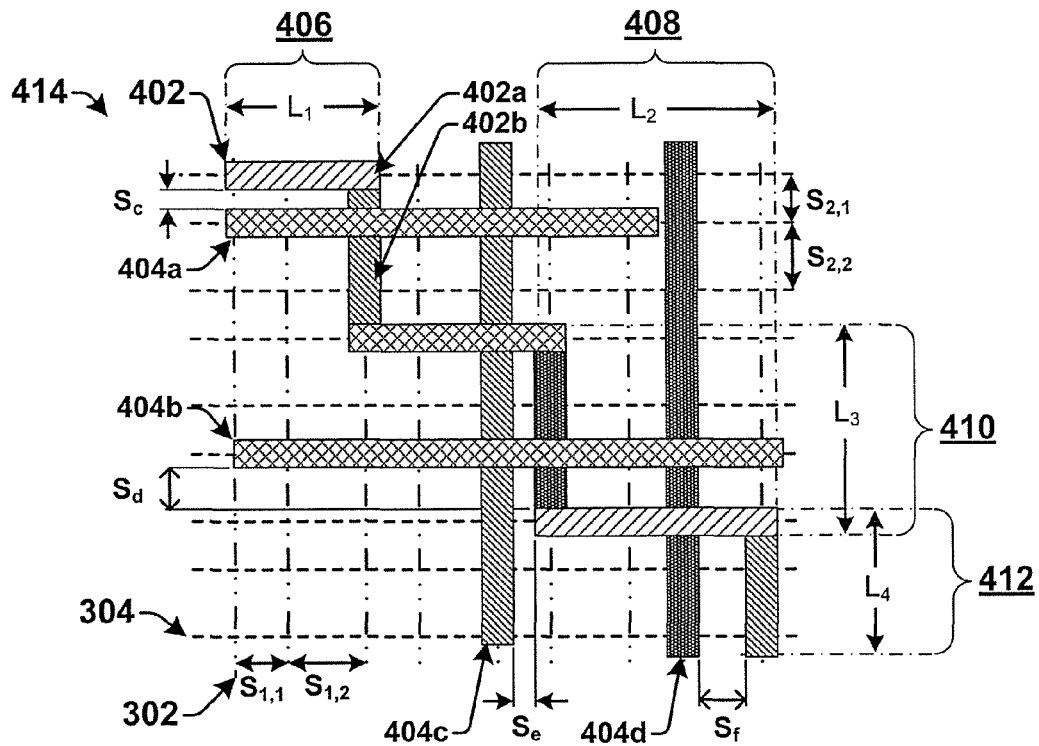
FIG. 4B illustrates some embodiments of an integrated circuit formed on the routing grid of FIG. 3 with mask misalignment.

FIGS. 3-4B show block diagrams of a double patterning layer comprising a metal line routed in accordance with some embodiments of the method 200. FIG. 3 illustrates some embodiments of exemplary routing grid, while FIGS. 4A-4B illustrate some embodiments of resulting integrated circuit laid out on the routing grid according to method 200.

Although FIGS. 3-4B are described in regards to a double patterning lithography process, it will be appreciated that the ideas provided herein may be extended to apply to multiple patterning lithography schemes that utilize multiple photomasks to form an integrated chip layer. For example, in a triple patterning lithography scheme, the disclosed method will define a routing grid having three distinct types of grid lines in the horizontal and vertical directions wherein each type of grid line is associated with a separate mask. For example, in some embodiments three colors are assigned to different types of grid lines in the horizontal direction (e.g., a first grid line is assigned a first color, an adjacent second grid line is assigned a second color, and an adjacent third grid line is assigned a third color) and three colors are assigned to different types of grid lines in the vertical direction. The method will then route shapes along a routing path that alternates between the three distinct grid lines in the horizontal and vertical direction (e.g., route the metal along a first color in the horizontal direction, a first color in the vertical direction, a second color in the horizontal direction, a second color in the vertical direction, a third color in the horizontal direction, a third color in the vertical direction).

FIG. 3 illustrates a top view of some embodiments of a routing grid 300 corresponding to the routing grid of step 202. The routing grid 300 comprises a plurality of vertical grid lines 302a, 302b, . . . , 302n extending along a first direction. The routing grid 300 further comprises a plurality of horizontal grid lines 304a, 304b, . . . , 304n extending along a second direction orthogonal to the first direction. Even vertical grid lines 302a, 302c, etc. are separated from odd vertical grid lines 302b, 302d, etc. by a first spacing $S_1$. Even horizontal grid lines 304a, 304c, etc. are separated from odd horizontal grid lines 304b, 304d, etc. by a second spacing $S_2$. In routing grid 300, the first and second spacing, $S_1$ and $S_2$, are shown as equal to one another (i.e., $S_1=S_2$), however in other embodiments the first and second spacing, $S_1$ and $S_2$, can be unequal. In some embodiments, one or more of the first and second spacing, $S_1$ and $S_2$, are equal to the minimum pitch of one or more double patterning layers as defined by technology ground rules.

FIG. 4A illustrates a block diagram of an integrated circuit 400 that is formed from a double patterning lithography process that has not experienced mask misalignment. The integrated circuit 400 is overlaid on routing grid 300. Shapes on alternating metal lines are written to different masks. For example, shapes on odd horizontal grid lines are written to a first mask denoted by a first fill pattern, shapes on even horizontal grid lines are written to a second mask denoted by a second fill pattern, shapes on odd vertical grid lines are written to a third mask denoted by a third fill pattern, and shapes on even vertical grid lines are written to a fourth mask denoted by a fourth fill pattern. Such mask assignments cause shapes on adjacent metal lines to be written to different masks (e.g.,), so that the lack of misalignment between masks is illustrated by an even spacing between adjacent metal lines.

The integrated circuit 400 has a routed metal line 402, formed according to step 204, which continuously extends along vertical and horizontal grid lines in a stair-step pattern. The routed metal line 402 alternates between even and odd vertical grid lines and between even and odd horizontal grid lines. The routed metal line 402 comprises a second metal layer 402a along the horizontal direction and a first metal layer 402b along the vertical direction. The second and first metal layers, 402a and 402b, are connected by vias (i.e., contacts) positioned between the second and first metal layers, 402a and 402b, at turns of the routing path. The integrated circuit 400 also comprises horizontal metal lines 404a, 404b comprising the second metal layer, which extend along horizontal grid lines 304 and vertical metal lines 404c, 404d comprising the first metal layer, which extend along vertical grid lines 302.

Because the routed metal line 402 and the horizontal metal lines 404a, 404b are formed along horizontal grid lines 304 that are evenly spaced (i.e., without misalignment), the horizontal metal lines 404a, 404b are separated from the routed metal line 402 by an even spacing $S_a$. For example, in a first horizontal region 406 (having a length $L_1$) routed metal line 402 is separated from horizontal metal line 404a by a spacing $S_a$ and in a second horizontal region 408 (having a length $L_2$) routed metal line 402 is separated from horizontal metal line 404b by spacing $S_a$. Similarly, because the routed metal line 402 and the vertical metal lines 404c, 404d are formed along vertical grid lines 302 that are evenly spaced, the vertical metal lines 404c, 404d are separated from the routed metal line 402 by an even spacing $S_b$. For example, in a first vertical region 410 (having a length $L_3$) routed metal line 402 is separated from vertical metal line 404c by spacing $S_b$ and in a second vertical region 412 (having a length $L_4$) routed metal line 402 is separated from vertical metal line 404d by spacing $S_b$. The spacing $S_a$ and $S_b$ result in a capacitive coupling between metal lines 402 and 404 of $C_{a,x}$ ($C_{a,x}=\in \cdot L_x/S_a$) and $C_{b,x}$ ($C_{b,x}=\in \cdot L_x/S_b$) in respective regions 406-408 and 410-412.

FIG. 4B illustrates a block diagram showing some embodiments of an integrated circuit 414 formed from a double patterning lithography that has experienced a mask misalignment. The integrated circuit 400 is overlaid on routing grid 300. Since shapes on adjacent metal or grid lines are written to different masks (e.g. shapes on odd vertical grid lines are written to a first mask denoted by a first fill pattern, shapes on even vertical grid lines are written to a second mask denoted by a second fill pattern, etc.), the mask misalignment is illustrated by an uneven spacing between adjacent metal or grid lines. For example, adjacent vertical grid lines 302 are separated by uneven spacings of $S_{1,1}$ and $S_{1,2}$.

The integrated circuit 414 has a routed metal line 402, formed according to step 204, which continuously extends along vertical and horizontal grid lines in a stair-step pattern that alternates between even and odd grid lines. The routed metal line 402 comprises a second metal layer 402a along the horizontal direction and a first metal layer 402b along the vertical direction. The integrated circuit 400 also comprises horizontal metal lines 404a, 404b comprising the second metal layer, which extend along horizontal grid lines 304 and vertical metal lines 404c, 404d comprising the first metal layer, which extend along vertical grid lines 302.

Because the routed metal line 402 and horizontal metal lines 404a, 404b are formed along horizontal grid lines 304 that are not evenly spaced (i.e., that have mask misalignment), the horizontal metal lines 404a, 404b are separated from the routed metal line 402 by uneven spaces. For example, in a first horizontal region 406 routed metal line 402 is separated from horizontal metal line 404a by a spacing $S_c$ ($S_c<S_a$) and in a second horizontal region 408 routed metal line 402 is separated from horizontal metal line 404b by a spacing $S_d$ ($S_d>S_a$). Similarly, because the routed metal line 402 and the vertical metal lines 404c, 404d are formed along vertical grid lines 302 that are not evenly spaced, the vertical metal lines 404c, 404d are also separated from the routed metal line 402 by uneven spaces. For example, in a first vertical region 410 routed metal line 402 is separated from vertical metal line 404c by spacing $S_e$ ($S_e<S_b$) and in a second vertical region 412 routed metal line 402 is separated from vertical metal line 404d by spacing $S_f$ ($S_f>S_b$).

By routing the routed metal line 402 along alternating even and odd grid lines variations in spacing experienced by the routed metal line 402 due to mask misalignment are statistically balanced over the routing path. This is because routing the routed metal line 402 along alternating even and odd grid lines causes the spacing between adjacent metal lines to alternatively be increased (to $S_d$ or $S_f$) and decreased (to $S_c$ or $S_e$) along the routing path. For example, in the first horizontal region 406 (having a length $L_1$) a mask misalignment will move the routed metal line 402 closer to an adjacent horizontal metal line 404a changing the spacing therebetween to $S_c$, while in the second horizontal region 408 (having a length $L_2$) the mask misalignment will move the routed metal line 402 further from an adjacent horizontal metal line 404b changing the spacing therebetween to $S_d$. Similarly, in the first vertical region 410 (having a length $L_3$) a mask misalignment will move the routed metal line 402 closer to an adjacent vertical metal line 404c, changing the spacing therebetween to $S_e$, while in the second vertical region 412 (having a length $L_4$) the mask misalignment will move the routed metal line 402 further from an adjacent vertical metal line 404d changing the spacing therebetween to $S_f$.

By balancing the variations in spacing, the consequences of mask misalignment are reduced. For example, the spacing $S_c$ results in a capacitive coupling $C_c$ ($C_c = \in \cdot L_1/S_c$) between routed metal line 402 and metal line segment 404a that greater than $C_{a,1}$, while the spacing $S_d$ results in a capacitive coupling $C_d$ ($C_d = \in \cdot L_2/S_d$) between routed metal line 402 and metal line 404b that is less than $C_{a,2}$. Similarly, the spacing $S_e$ results in a capacitive coupling $C_e$ ($C_e = \in \cdot L_3/S_e$) between routed metal line 402 and metal line segment 404c that is greater than $C_{b,3}$, while the spacing $S_f$ results in a capacitive coupling $C_f$ ($C_f = \in \cdot L_4/S_f$) between routed metal line 402 and vertical metal line 404d that is less than $C_{b,4}$. By balancing increases in the capacitive coupling ($C_c$) with decreases in the capacitive coupling ($C_d$), the overall variation in capacitive coupling between the routed metal line 402 and the horizontal metal lines 404a, 404b due to mask misalignment is statistically reduced over the routing path.

Figure 5:
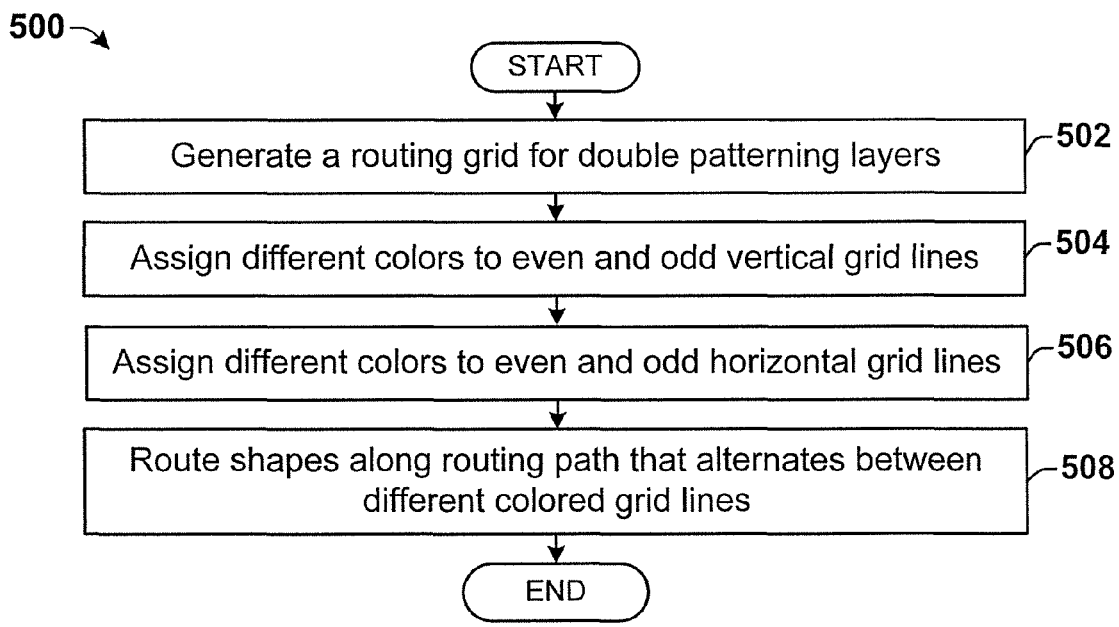
FIG. 5 is a flow diagram of an alternative method for balancing the effects of mask misalignment in a double patterning process, in accordance with some embodiments.

FIG. 5 is a flow diagram of some embodiments of a more detailed method 500 for balancing mask misalignment in a double patterning process. In method 500 different types of grid lines are assigned different colors and then shapes are routed along a routing path that alternates between different colors.

While the disclosed methods (e.g., method 200, 500) are illustrated and described below as a series of acts or events, it will be appreciated that the illustrated ordering of such acts or events are not to be interpreted in a limiting sense. For example, some acts may occur in different orders and/or concurrently with other acts or events apart from those illustrated and/or described herein. In addition, not all illustrated acts may be required to implement one or more aspects or embodiments of the description herein. Further, one or more of the acts depicted herein may be carried out in one or more separate acts and/or phases.

Figure 9:
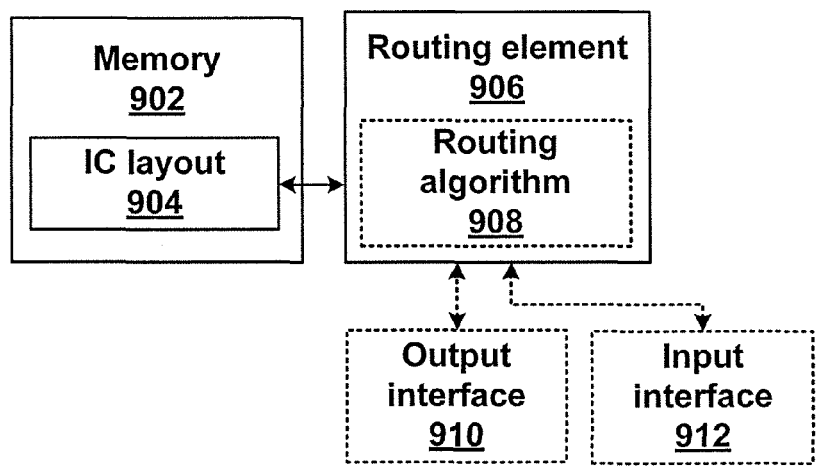
FIG. 9 illustrates some embodiments of a computer system configured to enable the disclosed method for mitigating the effects of mask misalignment in multi patterning lithography.

Furthermore, the disclosed methods may be implemented as a apparatus, or article of manufacture using standard programming and/or engineering techniques to produce software, firmware, hardware, or any combination thereof to control a computer to implement the disclosed subject matter (e.g., the circuits shown in FIG. 9. is a non-limiting example of circuits that may be used to implement the disclosed methods). The term "article of manufacture" as used herein is intended to encompass a computer program accessible from any computer-readable device, carrier, or media. Of course, those skilled in the art will recognize many modifications may be made to this configuration without departing from the scope or spirit of the claimed subject matter.

At step 502, a routing grid is generated for double patterning layers within an IC layout. The routing grid comprises a plurality of vertical grid lines extending along a first direction. The vertical grid lines define a routing grid for a first double patterning layer, comprising odd vertical grid lines (e.g., a first, third, fifth, etc., grid line) and even vertical grid lines (e.g., a second, fourth, sixth, etc., grid line). The routing grid also comprises a plurality of horizontal grid lines extending along a second direction, orthogonal to the first direction. The horizontal grid lines define a routing grid for a second double patterning layer, comprising odd horizontal grid lines (e.g., a first, third, fifth, etc., grid line) and even horizontal grid lines (e.g., a second, fourth, sixth, etc., grid line).

At step 504, even and odd vertical grid lines are assigned different colors. The even and odd vertical grid lines are interleavingly assigned two different colors for a first double patterning layer. For example, a first color is provided to a first vertical grid line, a second color is provided to a second vertical grid line adjacent to the first vertical grid line, the first color is provided to a third vertical grid line adjacent to the second vertical grid line, etc.

At step 506, even and odd horizontal grids lines are assigned different colors. The even and odd horizontal grid lines are interleavingly assigned two different colors for a second double patterning layer. For example, a third color is provided to a first horizontal grid line, a fourth color is provided to a second horizontal grid line adjacent to the first horizontal grid line, the third color is provided to a third horizontal grid line adjacent to the second horizontal grid line, etc. In some embodiments, the first and third color may comprise a same color and the second and fourth color may comprise a same color. In other embodiments, the first, second, third and fourth colors are distinct colors.

At step 508, shapes on the first and second double patterning layers are routed along a routing path that alternates between colors. In some embodiments, the routing path will sequentially extend along grid lines having a first color, a second color, a third color, and then a fourth color. This causes the routing path to alternate between colors in both the vertical and horizontal direction. For example, if a current vertical section of a routing path is along a vertical grid line having a first color, a next vertical section of the routing path is along a vertical grid line having a second color, and vice versa. Similarly, if a current horizontal section of a routing path is along a horizontal grid line having a third color, a next horizontal section of the routing path is along a horizontal grid line having a fourth color, and vice versa.

In various embodiments, method 500 may be configured to turn the routing path from a vertical direction to a horizontal direction or from a horizontal direction to a vertical direction based upon a wide range of criteria. For example, in some embodiments, the method 500 is configured to generate a routing path that turns from a horizontal direction to a vertical direction, or vice versa, after the routing path has crossed a predetermined number of grid lines. In some embodiments, the method 500 is configured to generate a routing path that undergoes a certain number of turns from a vertical direction to a horizontal direction in going from a first point to a second point. In some embodiments, the method 500 is configured to generate a routing path that turns from a vertical direction to a horizontal direction, or vice versa, after the routing path has gone in a certain direction for a predetermined distance (e.g., 5 um).

Figure 6A:
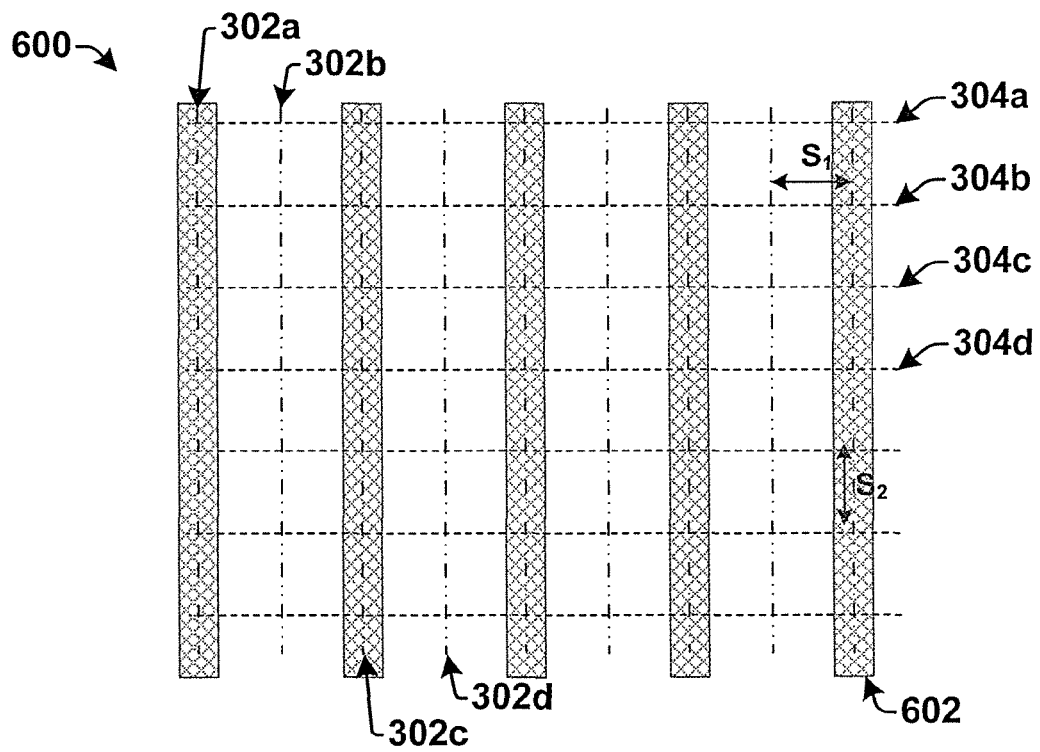
FIGS. 6A-6B illustrate some embodiments of a disclosed routing grid having a first color assigned to even vertical grid lines and a second color assigned to odd vertical grid lines.
Figure 6B:
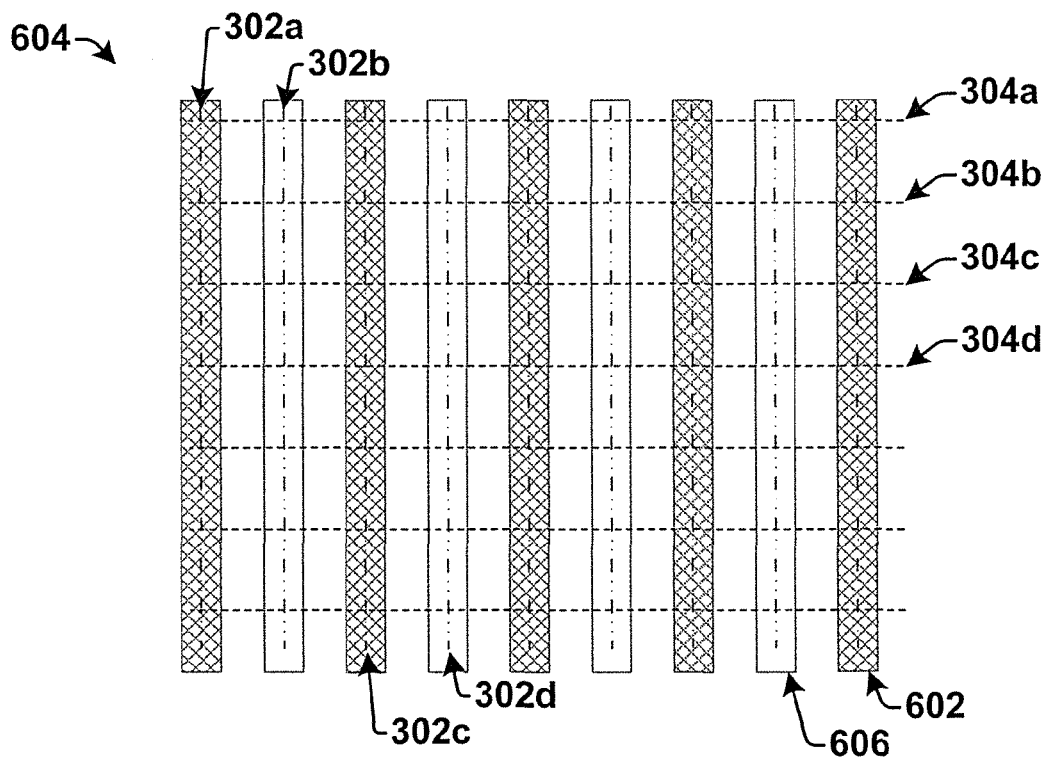
Figure 7A:
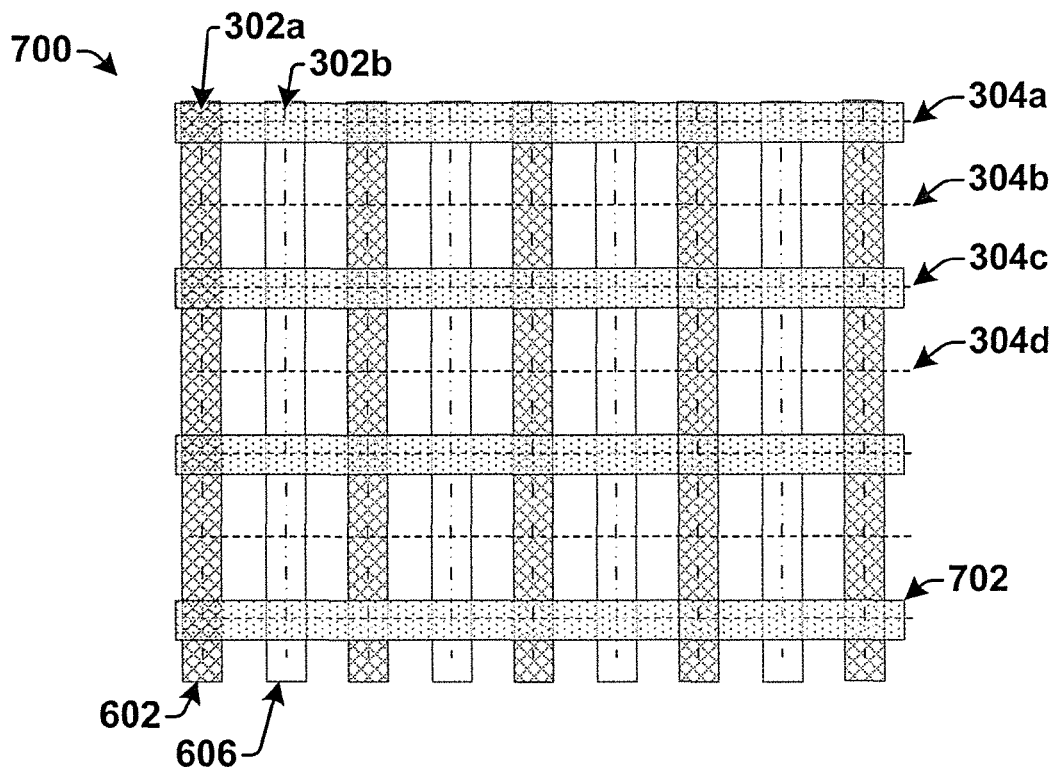
FIGS. 7A-7B illustrate some embodiments of a disclosed routing grid having a third color assigned to even horizontal grid lines and a fourth color assigned to odd horizontal grid lines.
Figure 7B:
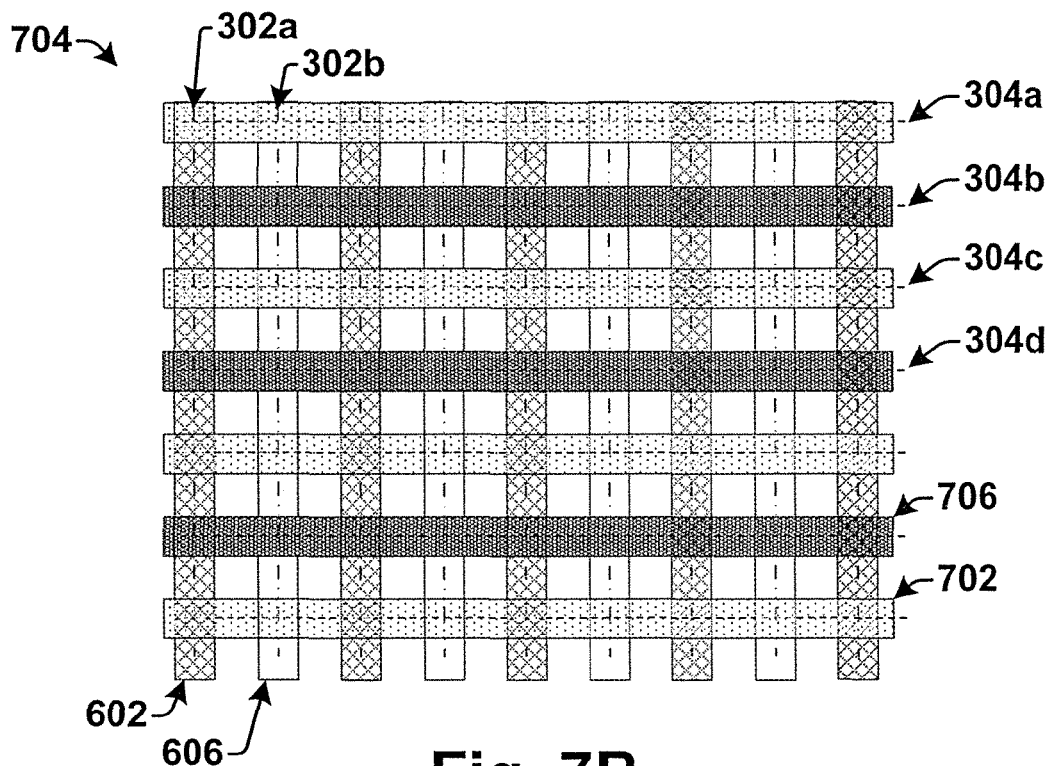
Figure 8:
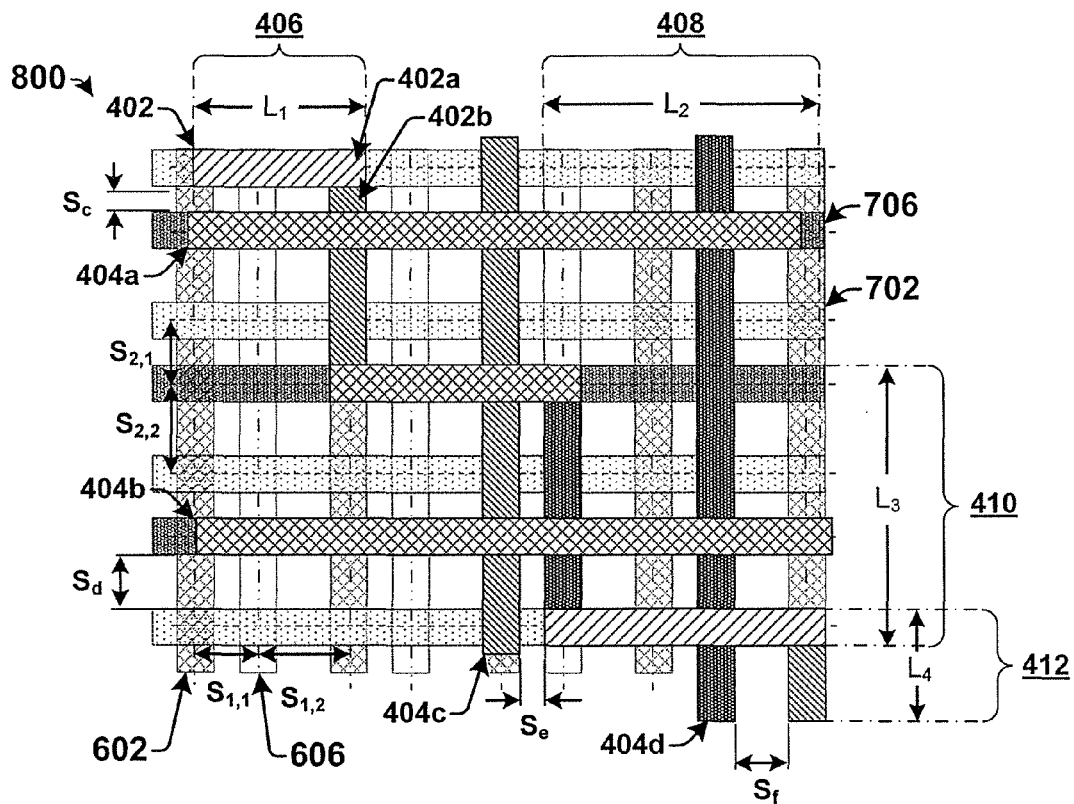
FIG. 8 illustrates some embodiments of an integrated circuit formed on the routing grid of FIG. 5 with mask misalignment.

FIGS. 6A-8 show block diagrams of a metal line routed in accordance with some embodiments of the method 500. FIGS. 6A-7B illustrate some embodiments of an exemplary colored routing grid, while FIG. 8 illustrates a resulting integrated circuit laid out on the colored routing grid according to method 500.

FIGS. 6A-6B illustrate top views of colored routing grids, 600 and 604, corresponding to step 504. FIG. 6A shows a colored routing grid 600 having a first color 602 provided to even vertical grid lines 302a, 302c, etc. on a first metal layer. FIG. 6B shows a colored routing grid 604 having a second color 606 provided to an odd vertical grid lines 302b, 302d, etc. on the first metal layer, wherein the odd vertical grid lines 302b, 302d, etc. are interleaved between the even vertical grid lines 302a, 302c, etc. The different colors, 602 and 606, are associated with different masks of the first metal layer. In some embodiments, the first color 602 is associated with a first mask and the second color 606 is associated with a second mask.

FIGS. 7A-7B illustrate top views of colored routing grids, 700 and 704, also corresponding to step 504. FIG. 7A shows a colored routing grid 700 having a third color 702 provided to even horizontal grid lines 304a, 304c, etc. on the second metal layer. FIG. 7B shows a colored routing grid 704 having a fourth color 706 provided to an odd horizontal grid lines 304b, 304d, etc. on the second metal layer, wherein the odd horizontal grid lines 304b, 304d, etc. are interleaved between the even horizontal grid lines 304a, 304c, etc. The different colors, 702 and 706, are associated with different masks of a second metal layer. In some embodiments, the third color 702 is associated with a third mask and the fourth color 706 is associated with a fourth mask.

FIG. 8 illustrates a top view of some embodiments of an integrated circuit 800 having a routed metal line 402 corresponding to step 508.

The integrated circuit 800 is overlaid on a colored routing grid to show mask misalignment resulting from a double patterning lithography process. Misalignment of the masks is illustrated by the uneven spacing of the grid lines. For example, grid lines assigned the first color 602 are associated with a first mask that is moved relative to grid lines assigned the second color 606, which is associated with a second mask. Similarly, grid lines assigned the third color 702 are associated with a third mask that is moved relative to grid lines assigned the fourth color 706, which is associated with a fourth mask.

The integrated circuit 800 has a routed metal line 402 that is formed along a routing path that alternates between a third color 702, a first color 602, a fourth color 706, and a second color 606. Therefore, in the horizontal direction the routed metal line 402 comprises a second metal layer 402a (e.g., metal 2) that alternates between grid lines assigned the third color 702 and the fourth color 706 and in the vertical direction the routed metal line 402 comprises a first metal layer 402b (e.g., metal 1) that alternates between grid lines assigned the first color 602 and the second color 606.

By routing the routed metal line 402 along alternating colored grid lines, capacitive variations experienced by the routed metal line 402 due to mask misalignment are statistically reduced. This is because routing the routed metal line 402 along alternating colored grid lines causes the spacing between adjacent metal lines to be alternatively increased (to $S_d$ and/or $S_f$) and decreased (to $S_c$ and/or $S_e$) along the routing path.

FIG. 9 illustrates some embodiments of a computer system 900 configured to automatically balance spacing variations caused by mask misalignment between a routed layer and adjacent structures on a multi patterning layer (e.g., double patterning layer).

The computer system 900 includes a memory element 902 and a routing element 906. Memory element 902 is configured to store an IC layout 904 comprising a graphical representation of an integrated chip, such as for example a GDSII file. In some embodiments, the memory element 902 comprises a machine readable storage medium, configured to store computer readable instructions for execution by processing unit 906, for example.

The routing element 906 is configured to receive the IC layout 904. The routing element 906 is configured to implement a routing algorithm 908 that executes the disclosed methods (e.g., method 200, 500). The routing element 906 is configured to generate a routing grid within the IC layout 904 having a plurality of vertical grid lines extending along a first direction and a plurality of horizontal grid lines extending along a second, orthogonal direction. In some embodiments, the routing element 906 is further configured to provide alternating colors to adjacent vertical grid lines and to adjacent horizontal grid lines.

In some embodiments, the routing element 906 may comprise an automatic place and route tool configured to route one or more multi patterning layers according to a predetermined algorithm or computer code. In some such embodiments, the routing element 906 may comprise a computer readable instruction stored in memory element 902 and executed by a processing unit 906.

In some other embodiments, wherein routing is manually performed, the routing element 906 is configured to provide an indicator to a designer by way of an output interface 910 that allows the routing element 906 to exchange information with the external environment. The indicator provides guidance to perform manual routing in a manner that alternatively switches a routed multi patterning layer between different vertical and horizontal grid lines. The output interface 910 may comprise a visual output (e.g., an LCD or LED screen), for example. In some embodiments, the computer system 900 further comprises one or more input interfaces 912 (e.g., a push button and/or a keyboard), that allows for a designer to perform the manual routing.

It will be appreciated that multi patterning lithography, as provided herein, may refer to any type of multi patterning exposure scheme. For example, double patterning lithography may comprise double dipole lithography (patterns are decomposed and formed on a first mask having only horizontal lines, and on a second mask having only vertical lines), double patterning technology (a vertex is formed of a vertical segment and a horizontal segment on a same mask), etc.

It will be appreciated that equivalent alterations and/or modifications may occur to one of ordinary skill in the art based upon a reading and/or understanding of the specification and annexed drawings. The disclosure herein includes all such modifications and alterations and is generally not intended to be limited thereby. In addition, while a particular feature or aspect may have been disclosed with respect to only one of several implementations, such feature or aspect may be combined with one or more other features and/or aspects of other implementations as may be desired. Furthermore, to the extent that the terms "includes", "having", "has", "with", and/or variants thereof are used herein, such terms are intended to be inclusive in meaning—like "comprising." Also, "exemplary" is merely meant to mean an example, rather than the best. It is also to be appreciated that features, layers and/or elements depicted herein are illustrated with particular dimensions and/or orientations relative to one another for purposes of simplicity and ease of understanding, and that the actual dimensions and/or orientations may differ substantially from that illustrated herein.

Therefore, the present disclosure relates to a method of automatically balancing the effects of mask misalignment for multiple patterning layers, so as to minimize the consequences of mask misalignment.

In some embodiments, the present disclosure relates to a method of routing. The method comprises of routing, comprising generating a routing grid for one or more multi patterning layers. The routing grid comprises a plurality of different types of vertical grid lines extending along a first direction and a plurality of different types of horizontal grid lines extending along a second, orthogonal direction. The method further comprises routing shapes on the one or more multi patterning layers along a routing path having a stair-step pattern that alternates between the different types of vertical and horizontal grid lines. The method further comprises writing the shapes routed on the different types of vertical and horizontal grid lines to different photomasks.

In other embodiments, the present disclosure relates to a method of routing. The method comprises generating a routing grid for double patterning layers comprising a plurality of vertical grid lines extending along a first direction and a plurality of horizontal grid lines extending along a second, orthogonal direction. Different colors are assigned to adjacent vertical grid lines. Different colors are assigned to adjacent horizontal grid lines. The method further comprises routing shapes on the double patterning layers along a routing path that alternates between the different colors of the vertical grid lines and the horizontal grid lines.

In other embodiments, the present disclosure relates to a computer system comprising a memory element configured to store an integrated chip layout. The computer system further comprises a routing element coupled to the memory element. The routing element is configured to generating a routing grid for one or more multi patterning layers, wherein the routing grid comprising a plurality of different types of vertical grid lines extending along a first direction and a plurality of different types of horizontal grid lines extending along a second, orthogonal direction. The routing element is further configured to route shapes on the one or more multi patterning layers along a routing path having a stair-step pattern that alternates between the different types of vertical and horizontal grid lines. The routing element is further configured to write the shapes routed on the different types of vertical and horizontal grid lines to different photomasks.

What is claimed is:

1. A method of routing, comprising:
generating a routing grid for one or more multi patterning layers, comprising a first type and a second type of vertical grid lines extending along a first direction and a first type and a second type of horizontal grid lines extending along a second, orthogonal direction;
routing shapes on the one or more multi patterning layers along a routing path having a stair-step pattern that alternates between the first or second type of vertical grid lines and the first or second type of horizontal grid lines; and
assigning colors to the shapes in a manner that causes:
the shapes routed on the first type of vertical grid lines and the shapes routed on the second type of vertical grid lines to be written to different photomasks; or
the shapes routed on the first type of horizontal grid lines and shapes routed on the second type of horizontal grid lines to be written to different photomasks.

2. The method of claim 1, wherein the first type of vertical grid lines are interleaved with the second type of vertical grid line, such that the shapes on the one or more multi patterning layers are routed along the routing path in a manner that causes the routing path to alternate between the first type of vertical grid lines and the second type of vertical grid lines.

3. The method of claim 2, further comprising:
assigning a first color to the first type of vertical grid lines, a second color to the second type of vertical grid lines, a third color to the first type of horizontal grid lines, and a fourth color to the second type of horizontal grid lines, wherein the first color, the second color, the third color, and the fourth color are different colors; and
routing the shapes on the one or more multi patterning layers in a manner that causes the routing path to alternate between the first, second, third and fourth colors in a repeating sequence.

4. The method of claim 2, wherein the routing grid comprises a minimum routing grid having vertical grid lines separated by a first minimum spacing and horizontal grid lines separated by a second minimum spacing.

5. The method of claim 2, wherein the routing path alternates between the vertical grid lines and the horizontal grid lines after the routing path has crossed a predetermined number of grid lines.

6. The method of claim 1, wherein the routing path comprises a first metallization layer routed on a vertical grid line and a second overlying metallization layer routed on an intersecting horizontal grid line, wherein the first metallization layer is connected to the second metallization layer by way of a metal via.

7. A method of routing, comprising:
generating a routing grid for double patterning layers comprising a plurality of vertical grid lines extending along a first direction and a plurality of horizontal grid lines extending along a second, orthogonal direction;
assigning different colors to adjacent vertical grid lines;
assigning different colors to adjacent horizontal grid lines; and
routing shapes on the double patterning layers along a routing path that alternates between the vertical grid lines having different colors and that alternates between the horizontal grid lines having different colors.

8. The method of claim 7, further comprising:
assigning a first color to even vertical grid lines, a second color to odd vertical grid lines adjacent to the even vertical grid lines, a third color to even horizontal grid lines, and a fourth color to odd horizontal grid lines adjacent to the even horizontal grid lines, wherein the first color, the second color, the third color, and the fourth color are different colors.

9. The method of claim 8, further comprising:
writing the shapes routed on grid lines assigned the first color to a first photomask;

writing the shapes routed on grid lines assigned the second color to a second photomask;

writing the shapes routed on grid lines assigned the third color to a third photomask; and writing the shapes routed on grid lines assigned the fourth color to a fourth photomask.

10. The method of claim 7, wherein the vertical grid lines are separated from one another by a first minimum spacing for a first double patterning layer; and wherein the horizontal grid lines are separated from one another by a second minimum spacing for a second double patterning layer.

11. The method of claim 7, further comprising:

providing an indicator to designers that provides guidance to route the shapes on the double patterning layers along the routing path in a manner that alternates between the different colors.

12. The method of claim 7, wherein routing the double patterning layer along the routing path is performed by an automatic place and route tool configured to automatically layout the shapes along the routing path in a manner that alternates between the different colors.

13. The method of claim 7, wherein the routing path alternates between a vertical grid line and a horizontal grid line after the routing path has cross a predetermined number of grid lines.

14. The method of claim 7, wherein the double patterning layers comprise metallization layers.

15. The method of claim 14, wherein the routing path comprising a first metallization layer routed on a vertical grid line and a second overlying metallization layer routed on an intersecting horizontal grid line, wherein the first metallization layer is connected to the second metallization layer by way of a metal via.

16. The method of claim 7, further comprising:

performing statistical analysis of the routing path to determine an amount of extra space within an integrated chip design that is to be allocated to account for mask misalignment.

17. A computer system, comprising:

a memory element configured to store an integrated chip layout;

a routing element coupled to the memory element and configured to perform the steps of:

generating a routing grid for one or more multi patterning layers, comprising a first type and a second type of vertical grid lines extending along a first direction and a first type and a second type of horizontal grid lines extending along a second, orthogonal direction;

routing shapes on the one or more multi patterning layers along a routing path having a stair-step pattern that alternates between the first or second type of vertical grid lines and the first or second type of horizontal grid lines; and assigning colors to the shapes in a manner that causes the shapes routed on the first type of vertical grid lines and shapes routed on the second type of vertical grid lines to be written to different photomasks.

18. The system of claim 17, wherein the first type of vertical grid lines are interleaved with the second type of vertical grid line, such that the shapes on the one or more multi patterning layers are routed along the routing path in a manner that causes the routing path to alternate between the first type of vertical grid lines and the second type of vertical grid lines.

19. The system of claim 18, wherein the routing element is further configured to perform the steps of:

assigning a first color to the first type of vertical grid lines, a second color to the second type of vertical grid lines, a third color to the first type of horizontal grid lines, and a fourth color to the second type of horizontal grid lines, wherein the first color, the second color, the third color, and the fourth color are different colors; and routing the shapes on the multi patterning layers in a manner that causes the routing path to alternate between the first, second, third and fourth colors in a repeating sequence.

20. The system of claim 17, wherein the routing path comprises a first metallization layer routed on a vertical grid line and a second overlying metallization layer routed on an intersecting horizontal grid line, wherein the first metallization layer is connected to the second metallization layer by way of a metal via.

* * * * *